United States Patent [19]

Matsuura

[11] Patent Number: 5,867,050
[45] Date of Patent: Feb. 2, 1999

[54] TIMING GENERATOR CIRCUIT

[75] Inventor: Satoshi Matsuura, Tokyo, Japan

[73] Assignee: Ando Electric Co., Ltd., Tokyo, Japan

[21] Appl. No.: 768,328

[22] Filed: Dec. 17, 1996

[30] Foreign Application Priority Data

Dec. 28, 1995 [JP] Japan .................................... 7-344183
Dec. 28, 1995 [JP] Japan .................................... 7-344184

[51] Int. Cl.$^6$ ................................................. G01R 31/28
[52] U.S. Cl. ............................ 327/294; 327/299; 371/24
[58] Field of Search .................................... 327/291, 293, 327/294, 299, 141, 144, 145; 371/22.1, 24

[56] References Cited

U.S. PATENT DOCUMENTS

| | | | |
|---|---|---|---|
| 4,755,758 | 7/1988 | Orihashi | 327/141 |
| 4,998,025 | 3/1991 | Watanabe | 327/141 |
| 5,406,132 | 4/1995 | Housako | 327/294 |

Primary Examiner—Tuan T. Lam
Attorney, Agent, or Firm—Finnegan, Henderson, Farabow, Garrett & Dunner, L.L.P.

[57] ABSTRACT

A timing generator circuit according to the present invention receives rate signal pulses and delay assignment data composed of rate number data and clock number data, and outputs timing signals delayed from the input timing of the rate signal pulses by intervals corresponding to the delay assignment data. The timing generator circuit comprises a counter for counting clock signals, which is reset by means of the rate signal pulses; a shift register for sequentially shifting the delay assignment data or data corresponding to the delay assignment data by means of the rate signal pulses; a coincidence detector for detecting data corresponding to predetermined rate number data from among output data from a stage of the shift register, and outputting pulses when clock number data contained in the output data coincide with count values of the counter; and a multiplexer for multiplexing the pulses outputted from the coincidence detector section and outputting the result as a timing signal.

4 Claims, 6 Drawing Sheets

TIMING GENERATOR CIRCUIT

BACKGROUND OF THE INVENTION

1. Technical Field of the Invention

The present invention relates to timing generator circuits used in TG (timing generator) sections of IC testers and the like, and more specifically to timing generator circuits which output rate signal pulses of undefined periods after delaying them by the intervals of clock periods assigned by delay assignment data which are provided in synchronization.

2. Background Art

In IC tests due to IC testers, constant measurement sequences are carried out at defined timings. For example, IC function tests are basically performed by the repetition of the following procedure.

a. Test patterns for the function test are read one at a time from a memory at timings which are defined by a program (a measurement program which determines the measurement procedure for the relevant IC).

b. Patterns corresponding to the IC input terminals are selected from among the binary data of "1"'s and "0"'s forming the readout pattern, and a voltage waveform corresponding to these "1"'s and "0"'s is supplied to each input terminal of the IC at a timing determined by the program.

c. As a result, response waveforms obtained from each output terminal of the IC are sampled at timings determined by the program, and the results are collated with the test patterns in order to judge whether or not the IC is functioning normally.

In order to properly perform these types of function tests, timing control must be performed so that the procedure can be performed with the determined timings.

Additionally, depending on the IC which is undergoing the test, instead of supplying the binary data forming a pattern immediately as an input waveform to the IC, there may be cases wherein a voltage waveform corresponding to the binary data is supplied to the IC after a time lag of a desired interval, or wherein a multiplexed clock signal is generated in accordance with the binary data and supplied to the IC. These types of tests require more complex timing control schemes.

Figure 5:
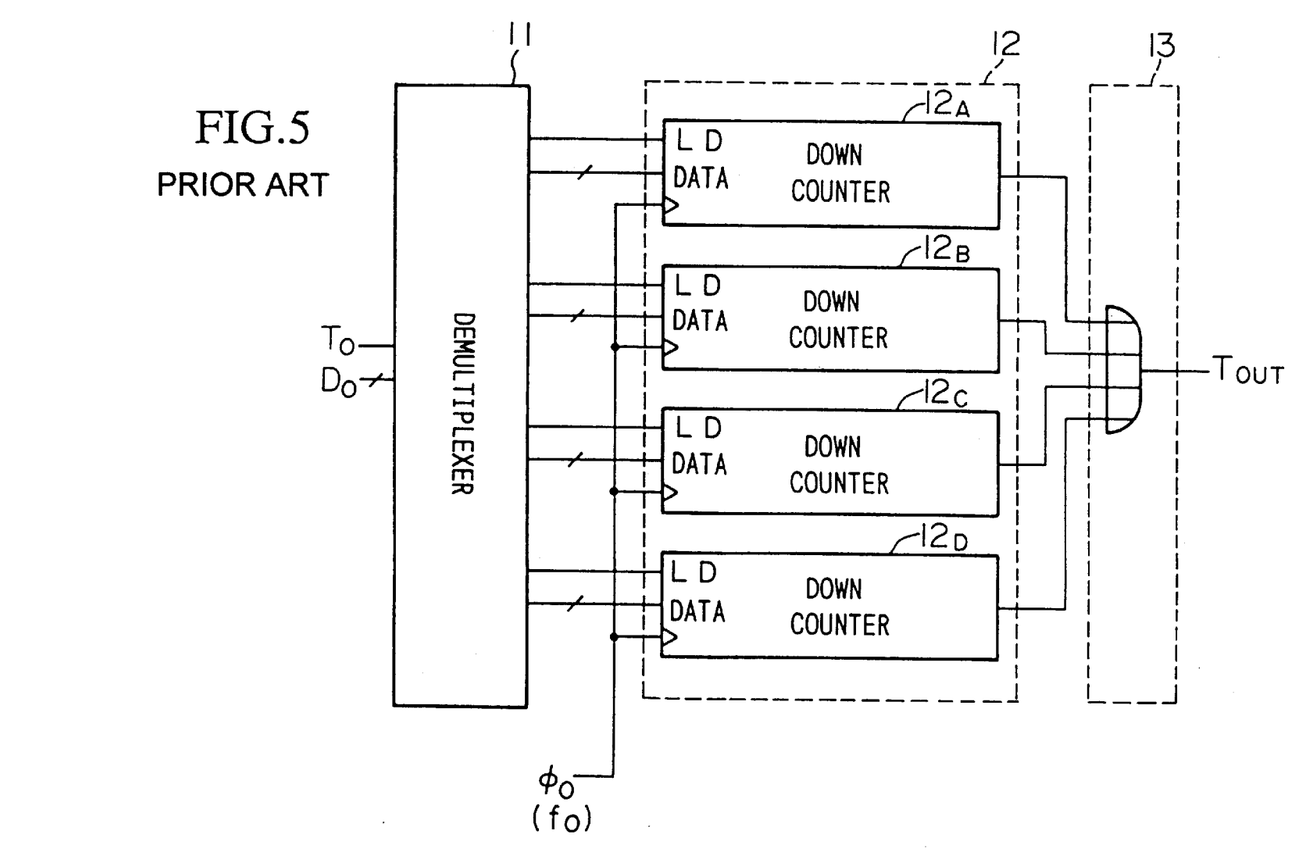
FIG. 5 is a block diagram showing an example of the structure of a conventional timing generator circuit.

As means for performing this type of timing control, various types of timing generator circuits are provided in IC testers. FIG. 5 shows an example of the structure of such a timing generator circuit. This timing generator circuit operates in synchronization with a clock signal $\phi_0$ having a constant frequency $f_0$, and delays rate signal pulses supplied from other circuitry inside the tester by a time interval assigned at a resolution of $1/f_0$, then outputs them as timing signals. Additionally, in this example, the structure is such as to be capable of delaying the rate signal pulses by 4 rates (wherein 1 rate is the interval between the rate signal pulses).

As shown in FIG. 5, this timing generator circuit comprises a demultiplexer 11, a counter section 12 and a multiplexer 13.

The demultiplexer 11 is a circuit which quadruple-interleaves delay assignment data $D_0$ and a rate pulse signal $T_0$ supplied from a control section (IC tester control system) which is not shown in the drawing, then outputs the results from first through fourth output terminals. That is, if this demultiplexer 11 outputs delay assignment data $D_0$ and a rate signal pulse $T_0$ supplied at a certain time from the first output terminal, the next delay assignment data $D_0$ and rate signal pulse $T_0$ are outputted from the second output terminal, and the next delay assignment data $D_0$ and rate signal pulse $T_0$ are outputted from the third output terminal, so as to output the delay assignment data $D_0$ and rate signal pulse $T_0$ while sequentially switching the output terminal.

The counter section 12 has four internal down-counters $12_A \sim 12_D$. These down-counters $12_A \sim 12_D$ have mutually independent load input terminals LD and data input terminals DATA. The rate signal pulse $T_0$ and delay assignment data $D_0$ quadruple-interleaved by the demultiplexer 11 are respectively supplied to the load input terminal LD and the data input terminal DATA of each down-counter. Additionally, the down-counters $12_A \sim 12_D$ each count down in accordance with a clock signal $\phi_0$ of frequency $f_0$, and output a pulse when the count value reaches "0". The multiplexer 13 multiplexes the four pulses obtained from these down-counters $12_A \sim 12_D$, then outputs the result as timing signal $T_{OUT}$.

As explained above, the demultiplexer 11 quadruple-interleaves and outputs rate signal pulses $T_0$ and delay assignment data $D_0$. Therefore, when considering the down-counters $12_A \sim 12_D$, each down-counter is supplied with a rate signal pulse $T_0$ and delay assignment data $D_0$ for each four rate signal pulses that arrive from the demultiplexer 11, and the delay assignment data $D_0$ is assigned as the initial count value. Each down-counter counts down from this initial value with the clock signal $\phi_0$ and generates a pulse when the count value becomes "0". That is, the down-counters $12_A \sim 12_D$ are able to count over three intervals of the rate signal pulses, i.e. over four rates; therefore, the rate signal pulses can be delayed by four rates.

Figure 6:
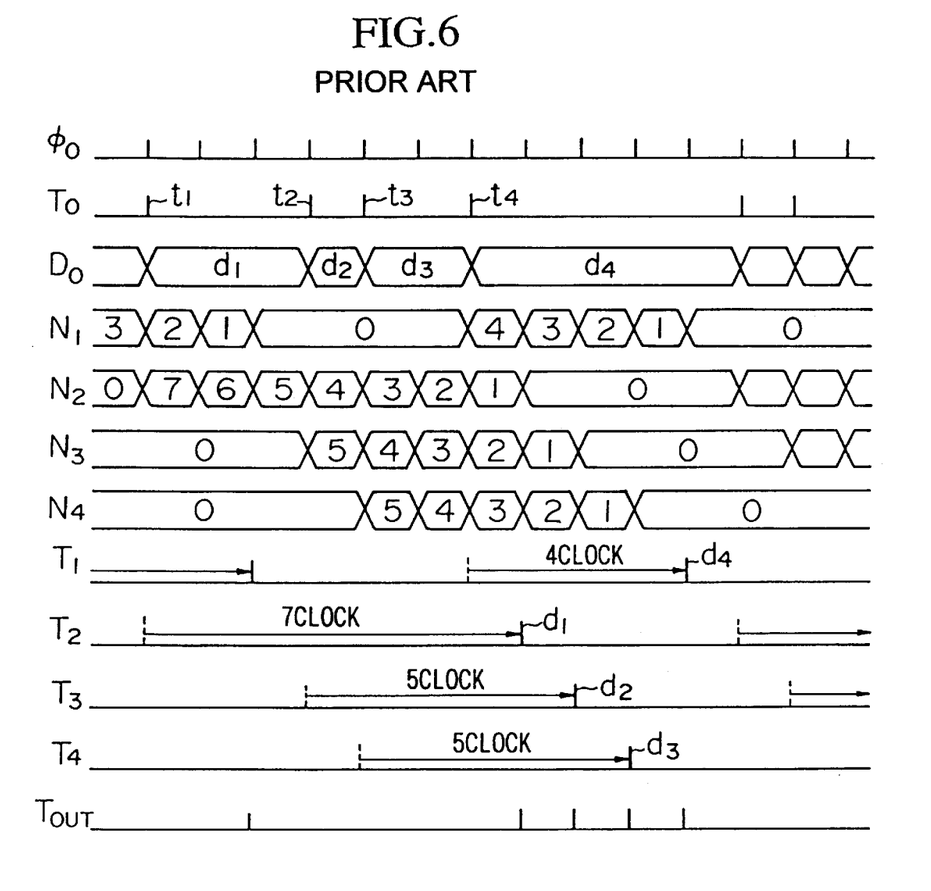
FIG. 6 is a time chart showing the operations of a conventional timing generator circuit.

FIG. 6 is a time chart showing the operations of the timing generator circuit. Hereinbelow, the operations of the timing generator circuit will be explained with reference to the diagram. In this diagram, $N_1 \sim N_4$ are the count values of the respective down-counters $12_A \sim 12_D$, $T_1 \sim T_4$ are the pulses outputted from the respective down-counters $12_A \sim 12_D$, and $T_{OUT}$ is a timing signal outputted from the multiplexer 13.

First, a rate signal pulse $T_0$ ($t_1$) and delay assignment data $D_0$ ($d_1$) are supplied, then inputted to the down-counter $12_B$ via the demultiplexer 11. In this example, a "7" which orders a "delay of 7 clock minutes" is supplied as the delay assignment data $D_0$ ($d_1$). Therefore, a "7" is assigned to the down-counter $12_B$, and a countdown is started with this "7" as the initial value in accordance with the clock signal $\phi_0$. In a similar manner, when the next rate signal pulse $T_0$ ($t_2$) and delay assignment data $D_0$ ($d_2$) (="5") are supplied, a "5" is assigned to the down-counter $12_C$ via the demultiplexer 11. At this time, the count value $N_2$ of the down-counter $12_B$ is "4", and a parallel countdown is performed in accordance with the clock signal $\phi_0$ by the down-counters $12_B$ and $12_C$.

When the next rate signal pulse $T_0$ ($t_3$) and delay assignment data $D_0$ ($d_3$) (="5") are supplied, a "5" is assigned to the down-counter $12_D$ via the demultiplexer 11. At this time, the count value $N_2$ of the down-counter $12_B$ is "3", the count value $N_3$ of the down-counter $12_C$ is "4", and a parallel countdown is performed in accordance with the clock signal $\phi_0$ by the down-counters $12_B$ and $12_C$ and $12_D$.

When the next rate signal pulse $T_0$ ($t_4$) and delay assignment data $D_0$ ($d_4$) (="4") are supplied, a "4" is assigned to the down-counter $12_A$ via the demultiplexer 11. At this time, the count values of the down-counters $12_B$, $12_C$ and $12_D$ are "1", "2" and "3", and a parallel countdown is performed by all of the down-counters. When the next clock signal $\phi_0$ is supplied, the value at the down-counter $12_B$ becomes "0", so that the down-counter $12_B$ generates a pulse $T_2$ and stops the countdown. Thereafter, the count values of the down-counters $12_C$, $12_D$ and $12_A$ sequentially become "0", so that each down-counter sequentially outputs a pulse $T_3$, $T_4$ and $T_1$, then stops the count. These pulses are multiplexed by the multiplexer 13 and supplied to the circuits inside the IC tester as timing signal $T_{OUT}$ so as to be used for timing control in the procedure for creating voltage waveforms to be supplied to the IC being tested.

In order to form IC testers which are capable of high-precision measurements, the resolution of the generation timing of the timing signals must be increased. Furthermore, in order to increase the resolution, the frequency $f_0$ of the clock signal $\phi_0$ supplied to the counter section 12 must be increased. However, the conventional timing generator circuit described above has a structure wherein n (n=4 in FIG. 5) down-counters are connected in parallel inside the counter section 12, so as to require a large amount of hardware which operates at high speeds of frequency $f_0$, thereby resulting in considerable power consumption and a high cost.

SUMMARY OF THE INVENTION

The present invention has been achieved in consideration of the above situations, and has the object of offering a timing generator circuit which is capable of generating high-resolution timing signals without increasing the amount of circuitry or consuming large amounts of power.

In order to resolve the above-mentioned problems, the present invention offers timing generator circuit for receiving rate signal pulses and delay assignment data composed of rate number data and clock number data, and outputting timing signals delayed from the input timing of the rate signal pulses by intervals corresponding to the delay assignment data; comprising a counter for counting clock signals, which is reset by means of the rate signal pulses; a shift register for sequentially shifting the delay assignment data or data corresponding to the delay assignment data by means of the rate signal pulses; a coincidence detector section for detecting data corresponding to predetermined rate number data from among output data from a stage of the shift register, and outputting pulses when clock number data contained in the output data coincide with count values of the counter; and a multiplexer section for multiplexing the pulses outputted from the coincidence detector section and outputting the result as a timing signal.

In the timing generator circuit according to the present invention, there is only a single counter which operates by means of a high-speed clock signal, and the shift register contains very little hardware while operating on a rate signal pulse with a frequency lower than the clock signal. Therefore, the energy consumption can be reduced. Additionally, the amount of hardware in the circuit overall can also be reduced.

PREFERRED EMBODIMENTS OF THE INVENTION

Hereinbelow, embodiments of the present invention will be explained with reference to the drawings.

[First Embodiment]

Figure 1:
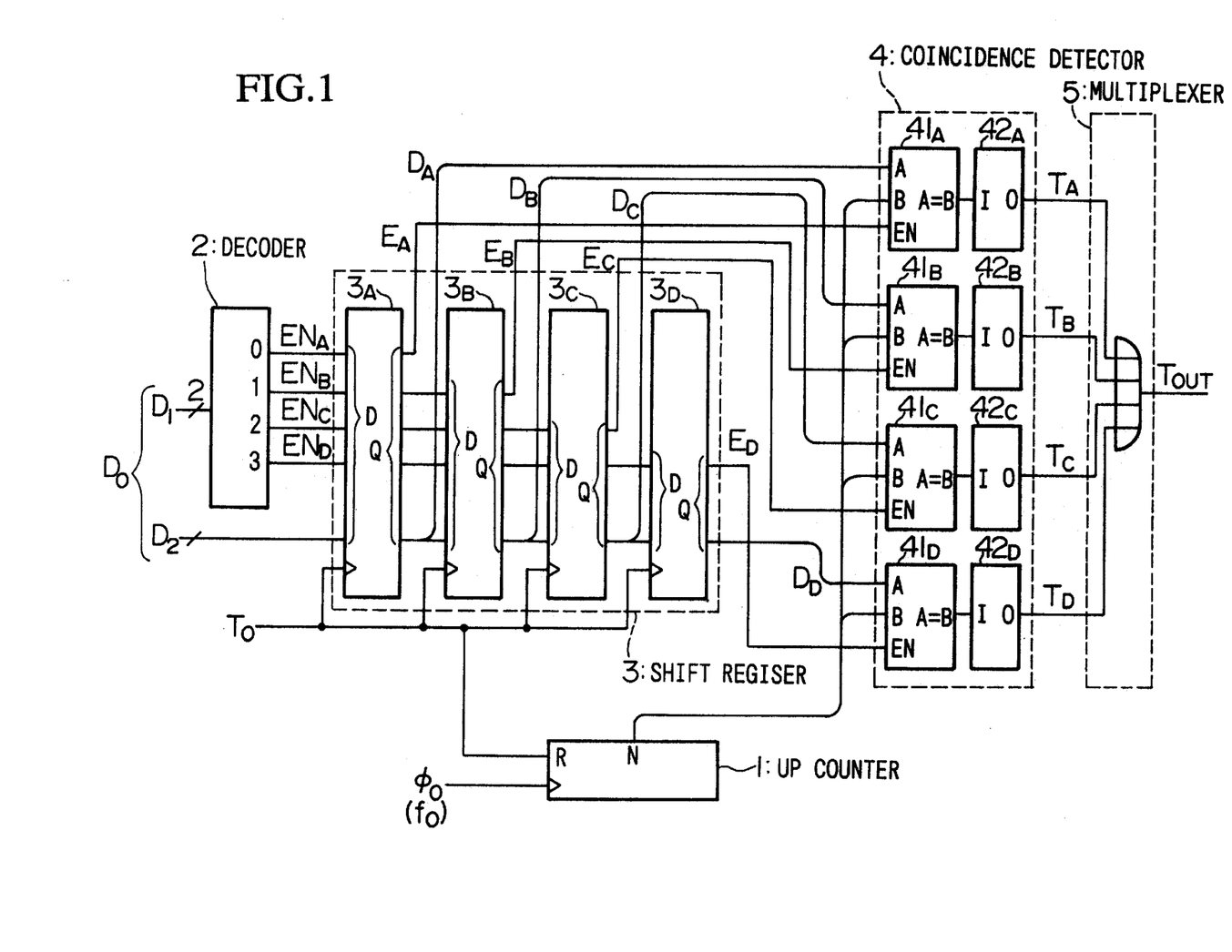
FIG. 1 is a block diagram showing a timing generator circuit according to a first embodiment of the present invention.

FIG. 1 is a block diagram showing a timing generator circuit according to a first embodiment of the present invention, which is capable of delaying for up to 4 rates. In the drawing, reference numeral 1 denotes an up-counter, reference numeral 2 denotes a decoder, reference numeral 3 denotes a four-stage shift register, reference numeral 4 denotes a coincidence detector, and reference numeral 5 denotes a multiplexer. This timing generator circuit is inputted with a rate signal pulse $T_0$ having an undefined period, and delay assignment data $D_0$ which is synchronized therewith. The delay assignment data $D_0$ is composed of rate number data $D_1$ for assigning the number of rates to be delayed, and clock number data $D_2$ for assigning the delay time within the rates.

The up-counter 1 receives the rate signal pulse $T_0$ inputted to the timing generator circuit as a reset input and the clock signal $\phi_0$ of frequency $f_0$ as a clock input, then counts up in accordance with the clock signal $\phi_0$.

The decoder 2 is a circuit for decoding the rate number data $D_1$ inputted to the timing generator circuit and outputting the result as signals $EN_A \sim EN_D$. In the present embodiment, the signals $EN_A \sim EN_D$ each go to level H when the rate number data $D_1$ are "0"~"3".

The shift register 3 receives data composed of the output signals $EN_A \sim EN_D$ of the decoder 2 and the clock number data $D_2$ as input data, and comprises four-staged latches $3_A \sim 3_D$ having the rate signal pulse $T_0$ as the clock. Of the data outputted from the latch $3_A$ of the first stage, the portion corresponding to the signal $EN_A$ is outputted as the output signal $E_A$ of the shift register 3, and the portion corresponding to the clock number data $D_2$ is outputted as data $D_A$. Additionally, of the data outputted from the latch $3_B$ of the second stage, the portion corresponding to the signal $EN_B$ is outputted as the output signal $E_B$ of the shift register 3, and the portion corresponding to the clock number data $D_2$ is outputted as data $D_B$. Similarly, the signals $E_C$ and data $D_C$ are outputted from the latch $3_C$ of the third stage, and the signals $E_D$ and data $D_D$ are outputted from the latch $3_D$ of the fourth stage.

The coincidence detector 4 has a quadruple-parallel structure, and comprises coincidence detector circuits $41_A \sim 41_D$ having enable functions, and pulse generator circuits $42_A \sim 42_D$ which are respectively connected in series therewith. The output signal $E_A$ of the shift register 3 is inputted to the enable input terminal EN of the coincidence detector $41_A$, the output signal $D_A$ of the shift register 3 is inputted to the first data input terminal A, and the count value N of the up-counter 1 is inputted to the second data input terminal B. Here, when the input signal level at the enable input terminal EN is at level H and the output signal $D_A$ of the shift register 3 corresponds with the count value N of the up-counter 1, the output signal of the coincidence detector circuit $41_A$ is created, in response to which a single pulse $T_A$ is generated from the pulse generator circuit $42_A$.

The same occurs with the coincidence detector circuits $41_B\sim41_D$ and the pulse generator circuits $42_B\sim42_D$. The multiplexer 5 multiplexes the pulses $T_{A\sim TD}$ which are outputted in parallel from the pulse generator circuits $42_A\sim42_D$ of the coincidence detector 4 into a single signal which is outputted as a timing signal $T_{OUT}$.

Figure 2:
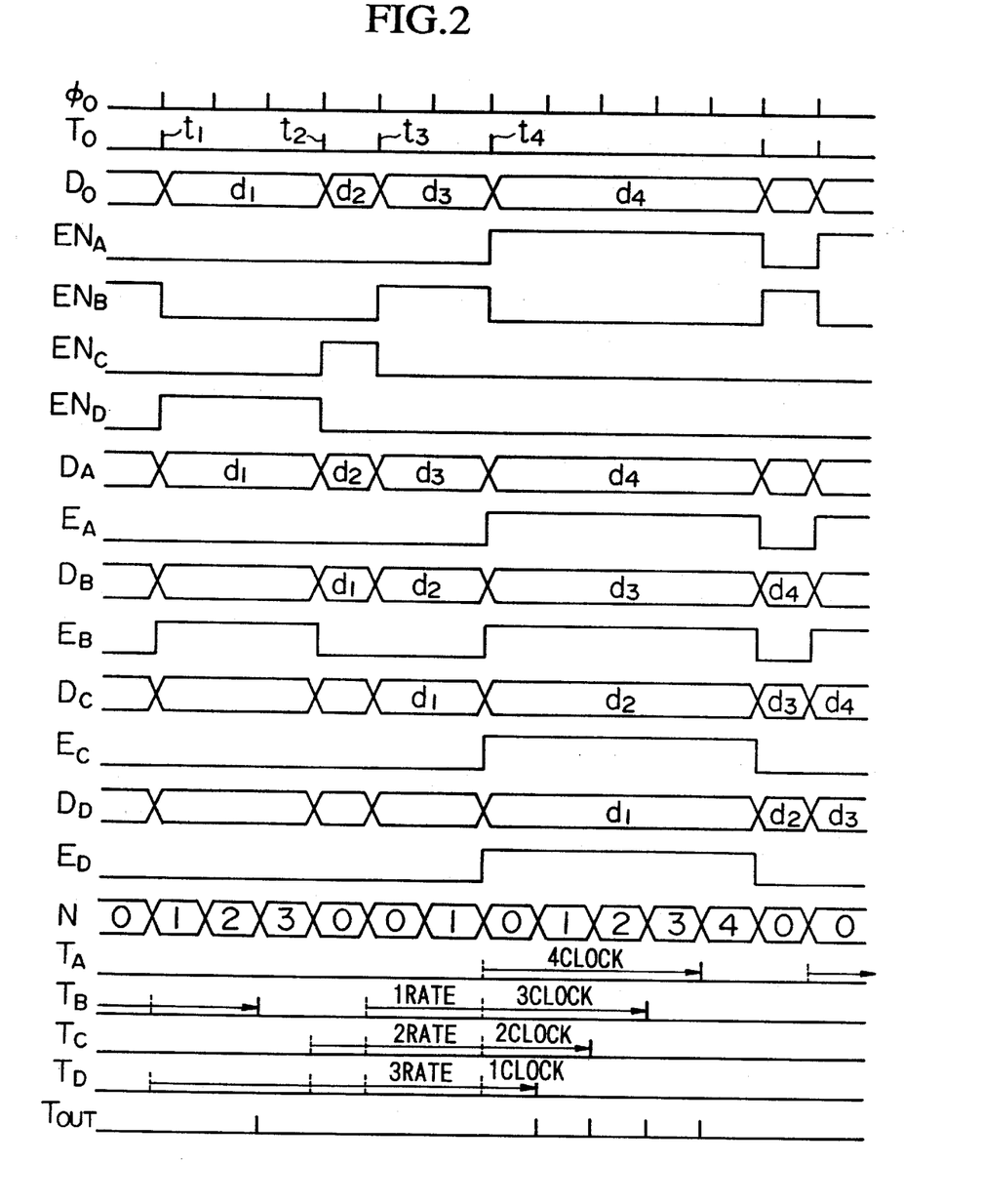
FIG. 2 is a time chart showing the operations of a timing generator circuit according to a first embodiment of the present invention.

FIG. 2 is a time chart showing the operations of a timing generator circuit according to a first embodiment of the present invention. Hereinbelow, the operations of the present embodiment will be explained with reference to this diagram.

First, a first rate signal pulse $T_0$ ($t_1$) and delay assignment data $D_0$ for assigning the delay amount of "3 rates+1 clock period" is supplied to this timing generator circuit. In this case, the delay assignment data $D_0$ is composed of rate number data $D_1$ (="3") assigning a delay of 3 rates and clock number data $D_2$ (="1") assigning a delay of 1 clock period. The rate number data $D_1$ (="3") is inputted to the decoder 2. As a result, only the signal $EN_D$ of the output signals $EN_A\sim EN_D$ of the decoder 2 goes to level H, and the others become level L. Then, input data composed of these signals $EN_A\sim EN_D$ and the clock number data $D_2$ (="1") are written into the first latch $3_A$ of the shift register 3 by means of the rate signal pulse $T_0$ ($t_1$).

The clock signal data $D_2$ ($d_1$) (="1") written into the first latch $3_A$ is supplied to the coincidence detector circuit $41_A$ as data $D_A$. However, at that time, an L-level signal $E_A$ (=$EN_A$) is supplied from the first latch $3_A$ to the enable terminal EN of the first coincidence detector circuit $41_A$. Consequently, the operation of the coincidence detector circuit $41_A$ is prohibited.

Next, a second rate signal pulse $T_0$ ($t_2$) is supplied along with delay assignment data $D_0$ ($d_2$) for assigning a delay of "2 rates+2 clock periods". In this case, the delay assignment data $D_0$ is composed of rate number data $D_1$ ($d_2$) (="2") assigning a delay of 2 rates and clock number data $D_2$ ($d_2$) (="2") assigning a delay of 2 clock periods. As a result of the rate number data $D_1$ ($d_2$) (="2") being supplied to the decoder 2, the signal $EN_C$ goes to level H. Then, due to the second rate signal pulse $T_0$ ($t_2$), the signal $EN_B$ (=L), signal $EN_C$ (=L), signal $EN_D$ (=H) and the clock number data $D_2$ ($d_1$) (="1") stored in the first latch $3_A$ are shifted to the second latch $3_B$.

Then, the clock signal data $D_2$ ($d_2$) written into the first latch $3_A$ is inputted to the coincidence detector circuit $41_A$ as data $D_A$, while an L-level signal $E_A$ (=$EN_A$) is supplied to the enable terminal EN of the first coincidence detector circuit $41_A$. Consequently, the operation of the coincidence detector circuit $41_A$ is prohibited. Additionally, the clock number data $D_2$ ($d_1$) shifted to the second latch $3_B$ is inputted to the second coincidence detector circuit $41_B$ as data $D_B$, while an L-level signal $E_B$ (=$EN_B$) is supplied to the enable terminal EN of the second coincidence detector circuit $41_B$. Consequently, the operation of the coincidence detector circuit $41_B$ is also prohibited.

Next, a third rate signal pulse $T_0$ ($t_3$) is supplied along with delay assignment data $D_0$ ($d_3$) for assigning a delay of "1 rate+3 clock periods". In this case, the delay assignment data $D_0$ is composed of rate number data $D_1$ ($d_3$) (="1") assigning a delay of 1 rate and clock number data $D_2$ ($d_3$) (="3") assigning a delay of 3 clock periods. As a result of the rate number data $D_1$ ($d_3$) (="1") being supplied to the decoder 2, the signal $EN_B$ goes to level H. Then, due to the third rate signal pulse $T_0$ ($t_3$), signal $EN_C$ (=H), signal $EN_D$ (=L) and the clock number data $D_2$ ($d_2$) (="2") stored in the second latch $3_B$ are shifted to the third latch $3_C$. Additionally, the signal $EN_B$ (=L), signal $EN_C$ (=H), signal $EN_D$ (=L) and the clock number data $D_2$ ($d_2$) (="2") stored in the first latch $3_A$ are shifted to the second latch $3_B$. Furthermore, input data composed of the output signals $EN_A\sim EN_D$ (only $EN_B$ is at level H) of the decoder 2 and the clock signal data $D_2$ ($d_3$) (="3") are written into the first latch $3_A$.

Then, the clock signal data $D_2$ ($d_3$) written into the first latch $3_A$ is inputted to the coincidence detector circuit $41_A$ as data $D_A$, while an L-level signal EA (=$EN_A$) is supplied to the enable terminal EN of the first coincidence detector circuit $41_A$. Consequently, the operation of the coincidence detector circuit $41_A$ is prohibited. Additionally, the clock number data $D_2$ ($d_2$) shifted to the second latch $3_B$ is inputted to the second coincidence detector circuit $41_B$ as data $D_B$, while an L-level signal $E_B$ (=$EN_B$) is supplied to the enable terminal EN of the second coincidence detector circuit $41_B$. Consequently, the operation of the coincidence detector circuit $41_B$ is also prohibited. Furthermore, the clock number data $D_2$ ($d_1$) shifted to the third latch $3_C$ is inputted to the third coincidence detector circuit $41_C$ as data $D_C$, while an L-level signal $E_C$ (=$EN_C$) is supplied to the enable terminal EN of the third coincidence detector circuit $41_C$. Consequently, the operation of the coincidence detector circuit $41_C$ is also prohibited.

Next, a fourth rate signal pulse $T_0$ ($t_4$) is supplied along with delay assignment data $D_0$ ($d_4$) for assigning a delay of "0 rates+4 clock periods". In this case, the delay assignment data $D_0$ is composed of rate number data $D_1$ ($d_4$) (="0") assigning a delay of 0 rates and clock number data $D_2$ ($d_4$) (="4") assigning a delay of 4 clock periods. As a result of the rate number data $D_1$ ($d_4$) (="0") being supplied to the decoder 2, the signal $EN_A$ goes to level H. Then, due to the fourth rate signal pulse $T_0$ ($t_4$), the signal $EN_D$ (=H) and the clock signal data $D_2$ ($d_1$) (="1") are shifted to the fourth latch $3_D$. Additionally, the signal $EN_C$ (=H), signal $EN_D$ (=L) and the clock number data $D_2$ ($d_2$) (="2") stored in the second latch $3_B$ are shifted to the third latch $3_C$. Additionally, the signal $EN_B$ (=H), signal $EN_C$ (=L), signal $EN_D$ (=L) and the clock number data $D_2$ ($d_3$) (="3") stored in the first latch $3_A$ are shifted to the second latch $3_B$. Furthermore, input data composed of the output signals $EN_A\sim EN_D$ (only $EN_A$ is at level H) of the decoder 2 and the clock signal data $D_2$ ($d_4$) (="4") are written into the first latch $3_A$.

The clock signal data $D_2$ ($d_4$) (="4") written in the first latch $3_A$ are inputted to the first coincidence circuit $41_A$ as data $D_A$. Then, since an H level signal $E_A$ (=$EN_A$) is supplied to the enable terminal EN of the first coincidence detector circuit $41_A$, operation of the coincidence circuit $41_A$ is allowed, and a comparison is made between the count value N of the up-counter 1 and the clock number data $D_2$ ($d_4$) (="4"). Therefore, the generation of 4 clock signals $\phi_0$ after the input of the rate signal pulse $T_0$ ($t_4$) results in the count value N of the up-counter 1 becoming "4", and a coincidence detection signal indicating that the two values coincide is outputted by the coincidence detector circuit $41_A$. As a result, a pulse $T_A$ is outputted from the pulse generator circuit $42_A$.

On the other hand, the clock signal data $D_2$ ($d_3$) (="3") written in the second latch $3_B$ are inputted to the second coincidence circuit $41_B$ as data $D_B$. Then, since an H level signal $E_B$ (=$EN_B$) is supplied to the enable terminal EN of the second coincidence detector circuit $41_B$, operation of the coincidence circuit $41_B$ is allowed, and a comparison is made between the count value N of the up-counter 1 and the clock number data $D_2$ ($d_3$) (="3"). Therefore, the generation of 3 clock signals $\phi_0$ after the input of the rate signal pulse $T_0$ ($t_4$) results in the count value N of the up-counter 1 becoming "3", and a coincidence detection signal indicating that the two values coincide is outputted by the coincidence detector circuit $41_B$. As a result, a pulse $T_B$ is outputted from the pulse generator circuit $42_B$.

Similarly, the clock signal data $D_2$ ($d_2$) (="2") written in the third latch $3_C$ are inputted to the third coincidence circuit $41_C$ as data $D_C$. Then, since an H level signal $E_C$ (=$EN_C$) is supplied to the enable terminal EN of the third coincidence detector circuit $41_C$, operation of the coincidence circuit $41_C$ is allowed, and a comparison is made between the count value N of the up-counter 1 and the clock number data $D_2$ ($d_2$) (="2"). Therefore, the generation of 2 clock signals $\phi_0$ after the input of the rate signal pulse $T_0$ ($t_4$) results in a coincidence detection signal being outputted by the coincidence detector circuit $41_C$. As a result, a pulse $T_C$ is outputted from the pulse generator circuit $42_C$.

Additionally, the clock signal data $D_2$ ($d_1$) (="1") written in the fourth latch $3_D$ are inputted to the fourth coincidence circuit $41_D$ as data $D_D$, while an H level signal $E_D$ (=$EN_D$) is supplied to the enable terminal EN of the fourth coincidence detector circuit $41_D$. As a result, the coincidence circuit $41_D$ makes a comparison between the count value N of the up-counter 1 and the clock number data $D_2$ ($d_1$) (="1"). Therefore, the generation of 1 clock signal $\phi_0$ after the input of the rate signal pulse $T_0$ ($t_4$) results in a coincidence detection signal being outputted by the coincidence detector circuit $41_D$. As a result, a pulse $T_D$ is outputted from the pulse generator circuit $42_D$.

The pulses generated in this way by the pulse generator circuits $42_A$~$42_D$ are multiplexed by the multiplexer 5, and outputted as a timing signal $T_{OUT}$. Thus, the present circuit is capable of counting over three rate signal pulse intervals, i.e. over four rates, so that a pulse delay of 4 rates is possible.

[Second Embodiment]

Next, a second embodiment of the present invention will be explained.

Figure 3:
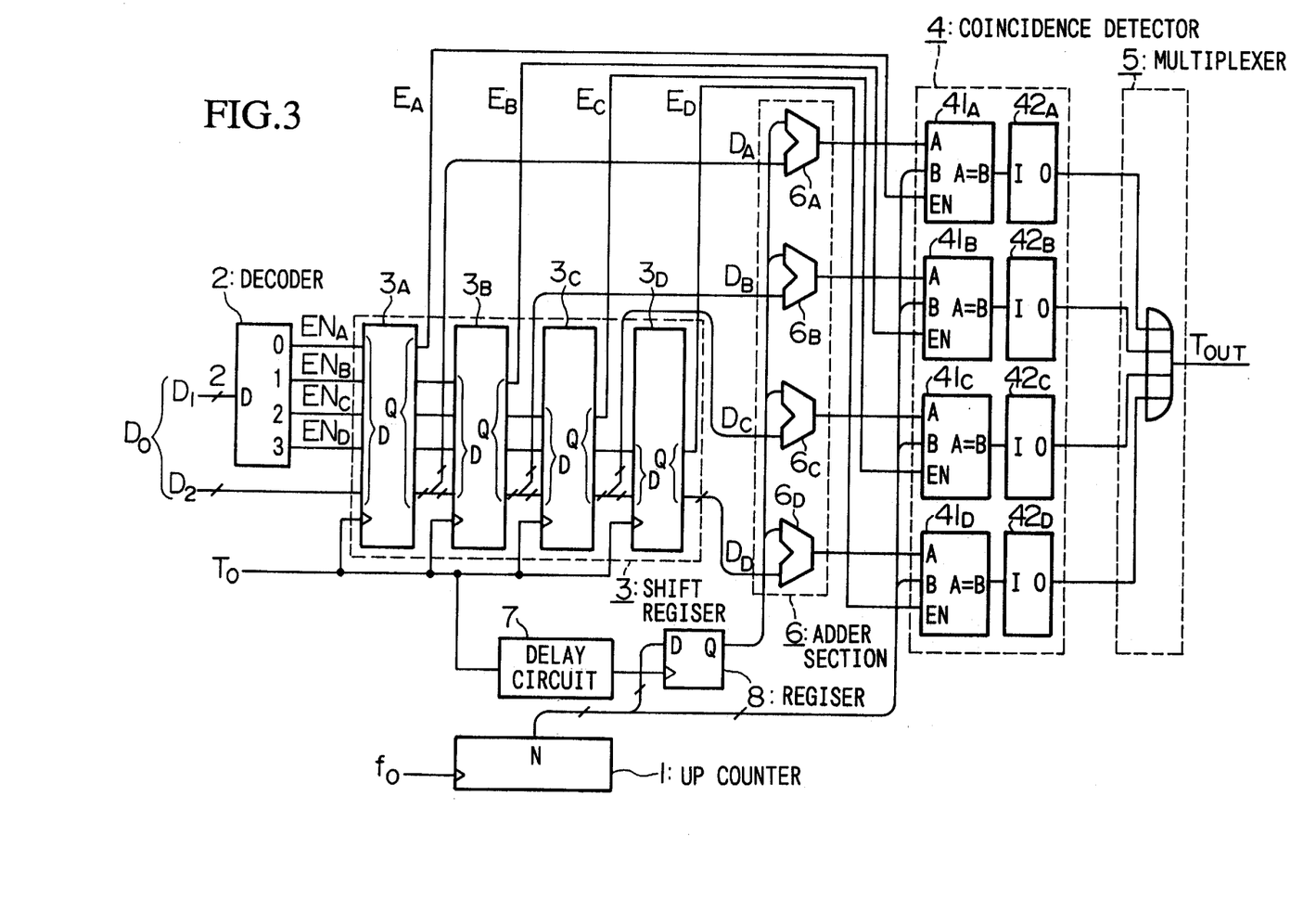
FIG. 3 is a block diagram showing a timing generator circuit according to a second embodiment of the present invention.

FIG. 3 is a block diagram showing a timing generator circuit according to a second embodiment of the present invention, which is capable of delaying for up to 4 rates as with the first embodiment. In the drawing, reference numeral 1 denotes an up-counter, reference numeral 2 denotes a decoder, reference numeral 3 denotes a four-stage shift register, reference numeral 4 denotes a coincidence detector, reference numeral 5 denotes a multiplexer, reference numeral 6 denotes an adder, reference numeral 7 denotes a delay circuit and reference numeral 8 denotes a register. This timing generator circuit is inputted with a rate signal pulse $T_0$ having an undefined period, and delay assignment data $D_0$ which is synchronized therewith. The delay assignment data $D_0$ is composed of rate number data $D_1$ for assigning the number of rates to be delayed, and lock number data $D_2$ for assigning the delay time within the rates.

The up-counter 1 receives a clock signal $\phi_0$ of frequency $f_0$ as a clock input and counts up. The delay circuit 7 delays the rate signal pulse $T_0$, then outputs the rate pulse signal $T_0$ to the register 8. The register 8 receives the count value N of the up-counter 1 as a data input, and the rate signal pulse $T_0$ delayed by the delay circuit 7 as a clock input. By inputting a delayed clock signal in this way, a count value N of the up-counter 1 which has been counted up by the clock signal $\phi_0$ is inputted to the register 8.

The decoder 2 is a circuit for decoding the rate number data $D_1$ inputted to the timing generator circuit and outputting the result as signals $EN_A$~$EN_D$. In the present embodiment, the signals $EN_A$~$EN_D$ each go to level H when the rate number data $D_1$ are "0"~"3".

The shift register 3 receives data composed of the output signals $EN_A$~$EN_D$ of the decoder 2 and the clock number data $D_2$ as input data, and comprises four-staged latches $3_A$~$3_D$ having the rate signal pulse $T_0$ as the clock. Of the data outputted from the latch $3_A$ of the first stage, the portion corresponding to the signal $EN_A$ is outputted as the output signal $E_A$ of the shift register 3, and the portion corresponding to the clock number data $D_2$ is outputted as data $D_A$. Additionally, of the data outputted from the latch $3_B$ of the second stage, the portion corresponding to the signal $EN_B$ is outputted as the output signal $E_B$ of the shift register 3, and the portion corresponding to the clock number data $D_2$ is outputted as data $D_B$. Similarly, the signals $E_C$ and data $D_C$ are outputted from the latch $3_C$ of the third stage, and the signals $E_D$ and data $D_D$ are outputted from the latch $3_D$ of the fourth stage.

The adder 6 has a quadruple-parallel structure, comprising adders $6_A$~$6_D$. The adder $6_A$ adds the data $D_A$ outputted from the shift register 3 and the output data of the register 8, and outputs the addition results. Similarly, the adder $6_B$ adds the data $D_B$ and the output data of the register 8, the adder $6_C$ adds the data $D_C$ and the output data of the register 8 and the adder $6_D$ adds the data $D_D$ and the output data of the register 8, then the addition results are outputted.

The coincidence detector 4 has a quadruple-parallel structure, and comprises coincidence detector circuits $41_A$~$41_D$ having enable functions, and pulse generator circuits $42_A$~$42_D$ which are respectively connected in series therewith. The output signal $E_A$ of the shift register 3 is inputted to the enable input terminal EN of the coincidence detector $41_A$, the output data of the adder $6_A$ is inputted to the first data input terminal A, and the output data $N_{REG}$ of the register 8 is inputted to the second data input terminal B. When the input signal level at the enable input terminal EN is at level H and the output data of the adder $6_A$ corresponds with the output data $N_{REG}$ of the register 8, the output signal of the coincidence detector circuit $41_A$ is created, in response to which a single pulse $T_A$ is generated from the pulse generator circuit $42_A$. The same occurs with the coincidence detector circuits $41_B$~$41_D$ and the pulse generator circuits $42_B$~$42_D$. The multiplexer 5 multiplexes the pulses $T_A$~$T_D$ which are outputted in parallel from the pulse generator circuits $42_A$~$42_D$ of the coincidence detector 4 into a single signal which is outputted as a timing signal $T_{OUT}$.

Figure 4:
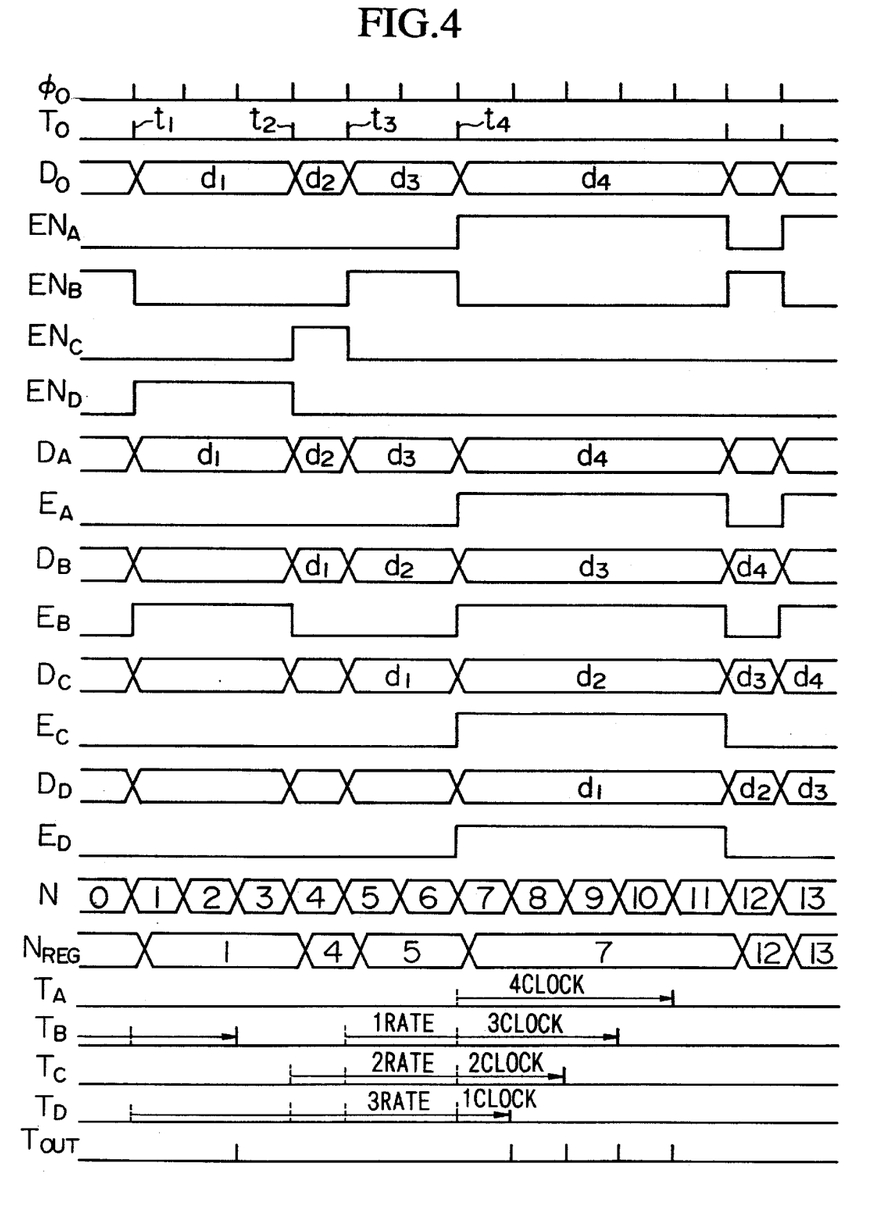
FIG. 4 is a time chart showing the operations of a timing generator circuit according to a second embodiment of the present invention.

FIG. 4 is a time chart showing the operations of a timing generator circuit according to a second embodiment of the present invention. Hereinbelow, the operations of the present embodiment will be explained with reference to this diagram.

First, a first rate signal pulse $T_0$ ($t_1$) and delay assignment data $D_0$ ($d_1$) for assigning the delay amount of "3 rates+1 clock period" is supplied to this timing generator circuit. In this case, the delay assignment data $D_0$ is composed of rate number data $D_1$ (="3") assigning a delay of 3 rates and clock number data $D_2$ (="1") assigning a delay of 1 clock period. The rate number data $D_1$ (="3") is inputted to the decoder 2. As a result, only the signal $EN_D$ of the output signals $EN_A$~$EN_D$ of the decoder 2 goes to level H, and the others become level L. Then, input data composed of these signals $EN_A$~$EN_D$ and the clock number data $D_2$ (="1") are written into the first latch $3_A$ of the shift register 3 by means of the rate signal pulse $T_0$ ($t_1$). Additionally, the rate signal pulse $T_0$ ($t_1$) is supplied to the clock input terminal of the register 8 via the delay circuit 7. As a result, the count value "1" of the up-counter 1 at this point in time is stored in the register 8.

The clock signal data $D_2$ ($d_1$) (="1") written into the first latch $3_A$ is supplied to the first adder $6_A$ of the adder 6 as data $D_A$, and the output data of this adder $6_A$ is supplied to the coincidence circuit $41_A$. However, at that time, an L-level signal $E_A$ (=$EN_A$) is supplied from the first latch $3_A$ to the enable terminal EN of the first coincidence detector circuit $41_A$. Consequently, the operation of the coincidence detector circuit $41_A$ is prohibited.

Next, a second rate signal pulse $T_0$ ($t_2$) is supplied along with delay assignment data $D_0$ ($d_2$) for assigning a delay of "2 rates+2 clock periods". In this case, the delay assignment data $D_0$ is composed of rate number data $D_1$ ($d_2$) (="2") assigning a delay of 2 rates and clock number data $D_2$ ($d_2$) (="2") assigning a delay of 2 clock periods. As a result of the rate number data $D_1$ ($d_2$) (="2") being supplied to the decoder 2, the signal $EN_C$ goes to level H. Then, due to the second rate signal pulse $T_0$ ($t_2$), the signal $EN_B$ (=L), signal $EN_C$ (=L), signal $EN_D$ (=H) and the clock number data $D_2$ ($d_1$) (="1") stored in the first latch $3_A$ are shifted to the second latch $3_B$. Additionally, input data composed of these signals $EN_A$~$EN_D$ (only $EN_C$ is at level H) and the clock number data $D_2$ ($d_2$) (="2") are written into the first latch $3_A$ by means of the rate signal pulse $T_0$ ($t_2$). Additionally, the rate signal pulse $T_0$ ($t_2$) is supplied to the clock input terminal of the register 8 via the delay circuit 7. As a result, the count value "4" of the up-counter 1 at this point in time is stored in the register 8.

Then, the clock signal data $D_2$ ($d_2$) written into the first latch $3_A$ is inputted as data $D_A$ to the adder $6_A$ of the adder section 6, while an L-level signal $E_A$ (=$EN_A$) is supplied to the enable terminal EN of the first coincidence detector circuit $41_A$. Consequently, the operation of the coincidence detector circuit $41_A$ is prohibited. Additionally, the clock number data $D_2$ ($d_1$) shifted to the second latch $3_B$ is inputted to the second adder $6_B$ as data $D_B$, and the output data of this adder $6_B$ is inputted to the second coincidence circuit $41_B$, while an L-level signal $E_B$ (=$EN_B$) is supplied to the enable terminal EN of the second coincidence detector circuit $41_B$. Consequently, the operation of the coincidence detector circuit $41_B$ is also prohibited.

Next, a third rate signal pulse $T_0$ ($t_3$) is supplied along with delay assignment data $D_0$ ($d_3$) for assigning a delay of "1 rate+3 clock periods". In this case, the delay assignment data $D_0$ is composed of rate number data $D_1$ ($d_3$) (="1") assigning a delay of 1 rate and clock number data $D_2$ ($d_3$) (="3") assigning a delay of 3 clock periods. As a result of the rate number data $D_1$ ($d_3$) (="1") being supplied to the decoder 2, the signal $EN_B$ goes to level H. Then, due to the third rate signal pulse $T_0$ ($t_3$), signal $EN_C$ (=L), signal $EN_D$ (=H) and the clock number data $D_2$ ($d_2$) (="2") stored in the second latch $3_B$ are shifted to the third latch $3_C$. Additionally, the signal $EN_B$ (=L), signal $EN_C$ (=H), signal $EN_D$ (=L) and the clock number data $D_2$ ($d_2$) (="2") stored in the first latch $3_A$ are shifted to the second latch $3_B$. Furthermore, input data composed of the output signals $EN_A$~$EN_D$ (only $EN_B$ is at level H) of the decoder 2 and the clock signal data $D_2$ ($d_3$) (="3") are written into the first latch $3_A$. Additionally, the rate signal pulse $T_0$ ($t_3$) is supplied to the clock input terminal of the register 8 via the delay circuit 7, and the count value "5" of the up-counter 1 at this time is stored in the register 8.

Then, the clock signal data $D_2$ ($d_3$) written into the first latch $3_A$ is inputted as data $D_A$ to the first adder $6_A$ of the adder section 6, while an L-level signal $E_A$ (=$EN_A$) is supplied to the enable terminal EN of the first coincidence detector circuit $41_A$. Consequently, the operation of the coincidence detector circuit $41_A$ is prohibited. Additionally, the clock number data $D_2$ ($d_2$) shifted to the second latch $3_B$ is inputted to the second coincidence detector circuit $41_B$ as data $D_B$, while an L-level signal $E_B$ (=$EN_B$) is supplied to the enable terminal EN of the second coincidence detector circuit $41_B$. Consequently, the operation of the coincidence detector circuit $41_B$ is also prohibited. Furthermore, the clock number data $D_2$ ($d_2$) shifted to the third latch $3_C$ is inputted to the third adder $6_C$ as data $D_C$, and the output data of this adder $6_C$ is inputted to the third coincidence detector, while an L-level signal $E_C$ (=$EN_C$) is supplied to the enable terminal EN of the third coincidence detector circuit $41_C$. Consequently, the operation of the coincidence detector circuit $41_C$ is also prohibited.

Next, a fourth rate signal pulse $T_0$ ($t_4$) is supplied along with delay assignment data $D_0$ ($d_4$) for assigning a delay of "0 rates+4 clock periods". In this case, the delay assignment data $D_0$ is composed of rate number data $D_1$ ($d_4$) (="0") assigning a delay of 0 rates and clock number data $D_2$ ($d_4$) (="4") assigning a delay of 4 clock periods. As a result of the rate number data $D_1$ ($d_4$) (="0") being supplied to the decoder 2, the signal $EN_A$ goes to level H. Then, due to the fourth rate signal pulse $T_0$ ($t_4$), the signal $EN_D$ (=H) and the clock signal data $D_2$ ($d_1$) (="1") are shifted to the fourth latch $3_D$. Additionally, the signal $EN_C$ (=H), signal $EN_D$ (=L) and the clock number data $D_2$ ($d_2$) (="2") stored in the second latch $3_B$ are shifted to the third latch $3_C$. Additionally, the signal $EN_B$ (=H), signal $EN_C$ (=L), signal $EN_D$ (=L) and the clock number data $D_2$ ($d_3$) (="3") stored in the first latch $3_A$ are shifted to the second latch $3_B$. Furthermore, input data composed of the output signals $EN_A$~$EN_D$ (only $EN_A$ is at level H) of the decoder 2 and the clock signal data $D_2$ ($d_4$) (="4") are written into the first latch $3_A$. Additionally, the rate signal pulse $T_0$ ($t_4$) is supplied to the clock input terminal of the register 8 via the delay circuit 7, and the count value "7" of the up-counter 1 at this time is stored in the register 8.

The clock signal data $D_2$ ($d_4$) (="4") written in the first latch $3_A$ are supplied as data $D_A$ to the first adder $6_A$ of the adder section 6, and added to the output data $N_{REG}$ (="7") of the register 8. Consequently, the addition result "11" is outputted from the adder $6_A$, and inputted to the first coincidence detector circuit $41_A$. Then, since an H level signal $E_A$ (=$EN_A$) is supplied to the enable terminal EN of the first coincidence detector circuit $41_A$, operation of the coincidence circuit $41_A$ is allowed, and a comparison is made between the count value N of the up-counter 1 and the addition result "11" of the adder $6_A$. Therefore, the generation of 4 clock signals $\phi_0$ after the input of the rate signal pulse $T_0$ ($t_4$) results in the count value N of the up-counter 1 becoming "11", and a coincidence detection signal indicating that the two values coincide is outputted by the coincidence detector circuit $41_A$. As a result, a pulse $T_A$ is outputted from the pulse generator circuit $42_A$.

On the other hand, the clock signal data $D_2$ ($d_3$) (="3") written in the second latch $3_B$ are supplied as data $D_B$ to the second adder $6_B$ of the adder section 6, and added to the output data $N_{REG}$ (="7") of the register 8. Consequently, the addition result "10" is outputted from the adder $6_B$, and inputted to the second coincidence detector circuit $41_B$. Then, since an H level signal $E_B$ (=$EN_B$) is supplied to the enable terminal EN of the second coincidence detector circuit $41_B$, operation of the coincidence circuit $41_B$ is allowed, and a comparison is made between the count value N of the up-counter 1 and the addition result "10" of the adder $6_B$. Therefore, the generation of 3 clock signals $\phi_0$ after the input of the rate signal pulse $T_0$ ($t_4$) results in the count value N of the up-counter 1 becoming "10", and a coincidence detection signal indicating that the two values coincide is outputted by the coincidence detector circuit $41_B$. As a result, a pulse $T_B$ is outputted from the pulse generator circuit $42_B$.

Similarly, the clock signal data $D_2$ ($d_2$) (="2") written in the third latch $3_C$ are supplied as data $D_C$ to the third adder $6_C$ of the adder section 6, and added to the output data $N_{REG}$ (="7") of the register 8. Consequently, the addition result "9" is outputted from the adder $6_C$, and inputted to the third coincidence detector circuit $41_C$. Then, since an H level signal $E_C$ (=$EN_C$) is supplied to the enable terminal EN of the third coincidence detector circuit $41_C$, operation of the coincidence circuit $41_C$ is allowed, and a comparison is made between the count value N of the up-counter 1 and the addition result "9" of the adder $6_C$. Therefore, the generation of 2 clock signals $\phi_0$ after the input of the rate signal pulse $T_0$ ($t_4$) results in a coincidence detection signal being outputted by the coincidence detector circuit $41_C$. As a result, a pulse $T_C$ is outputted from the pulse generator circuit $42_C$.

Additionally, the clock signal data $D_2$ ($d_1$) (="1") written in the fourth latch $3_D$ are supplied as data $D_D$ to the fourth adder $6_D$ of the adder section 6, and added to the output data $N_{REG}$ (="7") of the register 8. Consequently, the addition result "8" is outputted from the adder $6_D$, and inputted to the fourth coincidence detector circuit $41_D$. At this time, an H level signal $E_D$ (=$EN_D$) is supplied to the enable terminal EN of the fourth coincidence detector circuit $41_D$. As a result, the coincidence circuit $41_D$ makes a comparison between the count value N of the up-counter 1 and the addition result "8" of the adder $6_D$. Therefore, the generation of 1 clock signal $\phi_0$ after the input of the rate signal pulse $T_0$ ($t_4$) results in a coincidence detection signal being outputted by the coincidence detector circuit $41_D$, As a result, a pulse $T_D$ is outputted from the pulse generator circuit $42_D$.

The pulses generated in this way by the pulse generator circuits $42_A$–$42_D$ are multiplexed by the multiplexer 5, and outputted as a timing signal $T_{OUT}$. Thus, the present circuit is capable of counting over three rate signal pulse intervals, i.e. over four rates, so that a pulse delay of 4 rates is possible.

While the explanation of timing generator circuits according to the first embodiment and the second embodiment of the present invention as given above used examples wherein the maximum delay assignment value was 4 rates, the same operations are possible for maximum delay assignment values of n rates if the decoder 2, the shift register 3 and the coincidence detector section 4 are expanded.

I claim:

1. A timing generator circuit for receiving rate signal pulses and delay assignment data composed of rate number data and clock number data, and outputting timing signals delayed from the input timing of the rate signal pulses by intervals corresponding to said delay assignment data comprising;

a counter for counting clock signals, which is reset by means of said rate signal pulses;

a shift register for sequentially shifting said delay assignment data by means of said rate signal pulses;

a coincidence detector section for detecting data corresponding to said rate number data from among output data from each stage of said shift register, and outputting pulses when said clock number data contained in said output data coincide with count values of said counter; and     a multiplexer section for multiplexing the pulses outputted from said coincidence detector section and outputting the result as said timing signals.

2. A timing generator circuit in accordance with claim 1, having an input terminal for said rate number data and a plurality of output terminals, and a decoder in between said input terminal and said shift register for decoding the rate number data inputted from said input terminal and outputting the results from said plurality of output terminals to said shift register.

3. A timing generator circuit for receiving rate signal pulses and delay assignment data composed of rate number data and clock number data, and outputting timing signals delayed from the input timing of the rate signal pulses by intervals corresponding to said delay assignment data, comprising;

a counter for counting clock signals;

a shift register for sequentially shifting said delay assignment data by means of said rate signal pulses;

a register for storing count values of said counter when said rate signal pulses are received;

an adder section for adding data corresponding to said clock number data contained in output data from each stage of said shift register with the count values stored in said register, and outputting the addition results;

a coincidence detector section for detecting data corresponding to said rate number data from among said output data from each stage of said shift register, and outputting pulses when the addition results of said adder section coincide with count values of said counter; and     a multiplexer section for multiplexing the pulses outputted from said coincidence detector section and outputting the result as said timing signals.

4. A timing generator circuit in accordance with claim 3, having an input terminal for said rate number data and a plurality of output terminals, and a decoder in between said input terminal and said shift register for decoding the rate number data inputted from said input terminal and outputting the results from said plurality of output terminals to said shift register.

* * * * *

UNITED STATES PATENT AND TRADEMARK OFFICE
CERTIFICATE OF CORRECTION

PATENT NO. : 5,867,050
DATED : February 02, 1999
INVENTOR(S) : Satoshi Matsuura

It is certified that error appears in the above-identified patent and that said Letters Patent is hereby corrected as shown below:

Claim 1, column 11, lines 50-51, "data comprising;" should read --data, comprising:--.

Claim 3, column 12, lines 24-25, "comprising;" should read --comprising:--.

Signed and Sealed this

Fourteenth Day of September, 1999

Attest:

Q. TODD DICKINSON

*Attesting Officer*  *Acting Commissioner of Patents and Trademarks*